United States Patent
Vary et al.

(10) Patent No.: US 6,377,553 B1
(45) Date of Patent: Apr. 23, 2002

(54) METHOD AND DEVICE FOR ERROR MASKING IN DIGITAL TRANSMISSION SYSTEMS

(75) Inventors: Peter Vary; Tim Fingscheidt, both of Aachen (DE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/061,424

(22) Filed: Apr. 16, 1998

(30) Foreign Application Priority Data

Apr. 17, 1997 (DE) .......................................... 197 16 147

(51) Int. Cl.⁷ ................................................ H04L 1/00
(52) U.S. Cl. ...................................................... 370/252
(58) Field of Search ........................ 370/25, 241, 242, 370/244; 375/316, 340, 341, 346; 704/226, 228, 231, 233; 714/2, 4

(56) References Cited

U.S. PATENT DOCUMENTS

| | | |
|---|---|---|
| 5,212,549 A | 5/1993 | Ng et al. |
| 5,400,076 A | 3/1995 | Iwamura |
| 5,442,400 A | 8/1995 | Sun et al. |
| 5,502,713 A | 3/1996 | Lagerqvist et al. |
| 5,572,622 A * | 11/1996 | Wigren et al. ............. 395/2.37 |
| 5,598,506 A * | 1/1997 | Wingren et al. ........... 395/2.42 |
| 5,621,467 A | 4/1997 | Chien et al. |
| 5,901,186 A * | 5/1999 | Jamal et al. ................. 375/346 |

FOREIGN PATENT DOCUMENTS

| | | |
|---|---|---|
| DE | 4121480 | 2/1993 |
| DE | 4137609 | 5/1993 |
| DE | 4305578 | 9/1993 |
| EP | 0574288 | 1/1997 |

OTHER PUBLICATIONS

"Substitution and Muting of Lost Frames for Full Rate Speech Traffic Channels", ETSI/TC SMG Feb. 1992.
"Error Concealment by Softbit Speech Decoding", "Speech Communication" Conference Proceedings, Frankfurt am Main, Sep. 1996.

* cited by examiner

*Primary Examiner*—Ricky Ngo
(74) *Attorney, Agent, or Firm*—Ware, Freesola, Van Der Sluys & Adolphson LLP

(57) ABSTRACT

With a method and a device for error masking in digital transmission systems whereby a distribution function for estimating transmitted parameters is determined at the receiving end, the method provides that a distribution function is adjusted around the output signal value of a predictor and is integrated by sections into a new distribution function; this new distribution function is multiplied by a distribution function which takes the received quality into consideration and the result of an a posteriori distribution which can be used with conventional estimation methods for the final parameter estimation.

16 Claims, 1 Drawing Sheet

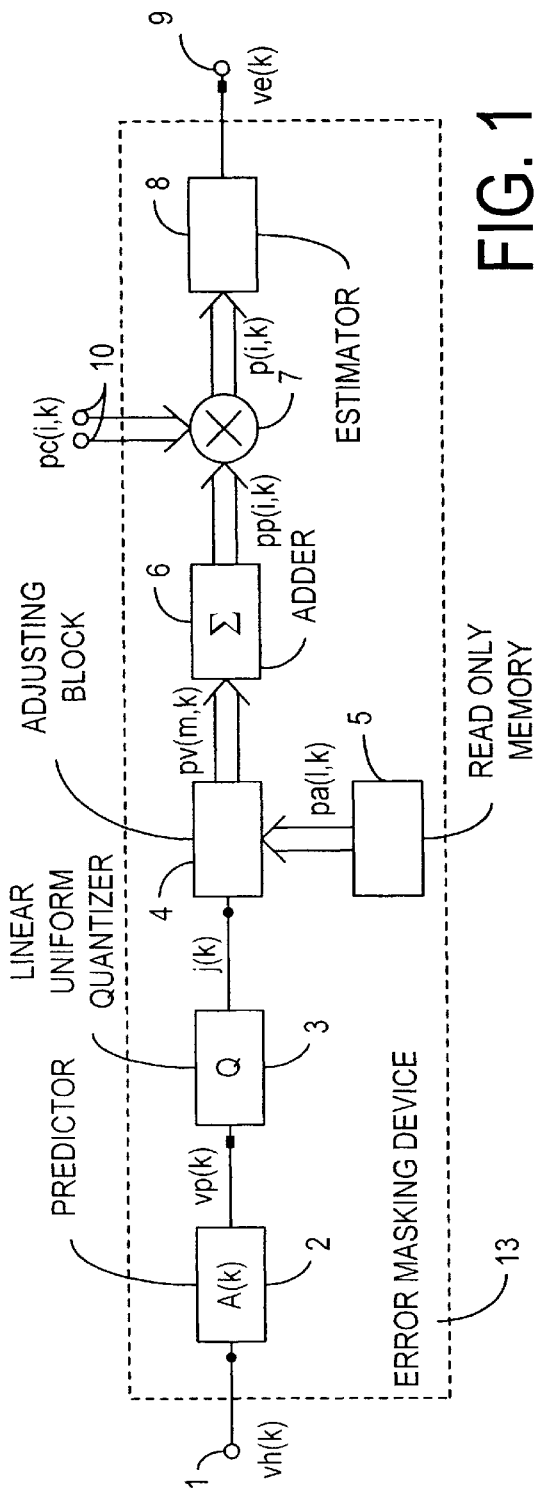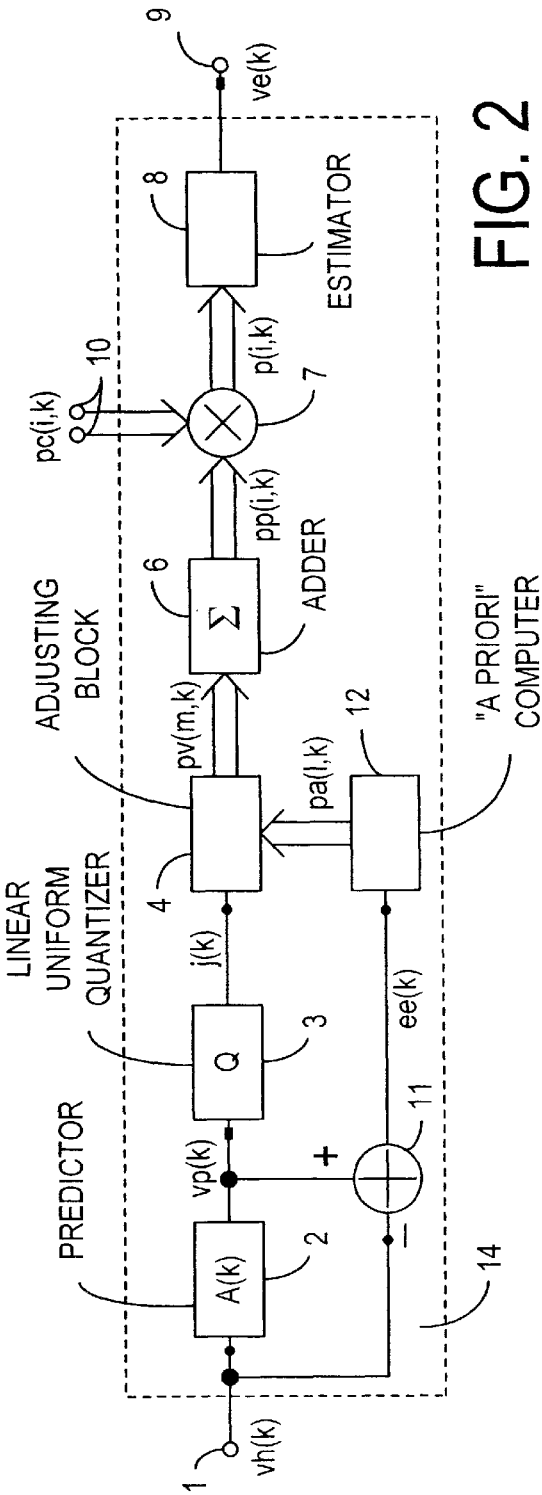

METHOD AND DEVICE FOR ERROR MASKING IN DIGITAL TRANSMISSION SYSTEMS

TECHNICAL FIELD

The invention concerns a method for error masking and improvement of the signal quality in digital transmission systems, in which a distribution function for estimating transmitted parameters is determined at the receiving end.

BACKGROUND OF THE INVENTION

To enable masking errors on the receiving end of digital transmission systems for audio, speech or video signals, frame repetition methods are presently used which repeat the last correctly received bit frame (or parts thereof) (e.g. Recommendation GSM 06.11 "Substitution and Muting of Lost Frames for Full Rate Speech Traffic Channels", ETSI/TC SMG, February 1992). This repetition of frames is initiated by binary frame reliability information, which can be obtained e.g. from the received field strength, from metric differences of a channel decoder, or also from the evaluation of an error detection method. Additional methods (e.g. T. Lagerqvist, T. B. Minde, P. Mustel and H. Nilsson "Soft Error Concealment in a TDMA Radio System", U.S. Pat. No. #5,502,713, December 1993) are able to carry out a weighted combination of source-codec parameters of the current frame and of preceding ones, where the weighting reflects the error probabilities of the frame or the error probabilities of the parameter.

Disadvantages of the State of the Art I

Disadvantages of these methods are the relatively quick decline in the decoded audio-speech-video quality if the transmission channel becomes increasingly unreliable. This becomes noticeable as a function of the source coding method being used, e.g. by extremely disruptive click or modulation effects, which must often be suppressed by the additional use of muting switch mechanisms. In that case the quality of the reconstructed signals obviously declines as well.

Furthermore the weighted aggregation of current and preceding frames only models very vaguely the statistical behavior of the source-codec parameters, which leads to respectively inaccurate estimation results. In addition the use of an error probability alone for a received source-codec parameter value (or the bit combination representing it) is less than optimal as compared to the case where a respective probability is known at the receiving end for each possible transmitted parameter value.

State of the Art II

The error masking can be improved if, as is known from "Error Concealment by Softbit Speech Decoding", ITG "Speech Communication" Conference Proceedings, Frankfurt am Main, September 1996, the quantized source-codec parameters are modeled as discrete value mark-off processes of the Nth order, and a probability distribution of all possible transmitted parameter values is known at every moment. This technique estimates every source-codec parameter by using individual parameter estimation methods.

Disadvantages of the State of the Art II

This method however has an exponentially increasing need for memory as a function of the number of bits M of the source-codec parameter to be estimated, in conjunction with the model order N, and an exponentially increasing numeric complexity. For that reason, source-codec parameters with a high number of bits M could only be estimated with low model orders N until now.

SUMMARY OF THE INVENTION

The object of the invention is to create a method and a device for masking errors in digital transmission systems, which achieves a far reaching improvement in the quality of the speech or audio or video signals, and only requires a small amount of memory and numeric complexity.

This object is achieved by a method and device for error masking and improvement of the signal quality in digital transmission systems, in which a distribution function for estimating transmitted parameters is determined at the receiving end, wherein a distribution function is adjusted around the output value of a predictor, and is integrated by sections into a new distribution function, and this new distribution function is multiplied by a distribution function which takes into account the reception quality and the result of an a posteriori distribution which can be used with conventional estimation methods for the final parameter estimation.

This object is also achieved by a device for error masking and improvement of the signal quality in digital transmission systems, in which a distribution function for estimating transmitted parameters is determined at the receiving end, by a distribution function estimating means, wherein the distribution function estimating means has means for causing the distribution function to be adjusted around the output value of a predictor, and to be integrated by sections into a new distribution function, and further having means for multiplying the new distribution function by a distribution function that takes into account the reception quality as well as the result of an a posteriori distribution which can be used with conventional estimation methods for determining the final parameter estimation.

Advantages of the Invention

The method of the invention is suitable e.g. for digital mobile radio receivers, digital cordless telephones, digital radio receivers, but also for the ATM transmission of speech and audio signals. It can also be applied to video picture transmission. In principle it can be used in all areas where reliability information is available for every received source-coded bit or bit groups as well. The predictor provided by the method enables the calculation of a probability distribution for every possible transmitted source-codec parameter, where a clearly reduced memory need and a clearly reduced numeric complexity can be achieved by comparison with the state of the art. The order of the predictor can be chosen with a marginal influence on the memory needed and the numeric complexity of the entire device, so that as much of the residual correlation of the parameter to be estimated as possible can be utilized for the error masking. This in turn promotes a clearly improved masking of the transmission error.

Beyond that, the method of the invention makes possible an efficient estimate of non-stationary source-codec parameters as well.

BRIEF DESCRIPTION OF THE DRAWINGS

Embodiments of the invention are illustrated in the drawing with several figures which are explained in greater detail in the following, where:

FIG. 1 Is a block circuit diagram in a simple configuration of a method of the invention.

FIG. 2 Is a block circuit diagram of a method of the invention for estimating parameters with a nonstationary stationary predictive error signal.

BEST MODE FOR CARRYING OUT THE INVENTION

Although the embodiments according to FIGS. 1, 2 are illustrated as block circuit diagrams, this does not mean however that the method of the invention is limited to an accomplishment with help from individual circuits which correspond to the blocks. In a particularly advantageous manner the method of the invention can rather be carried out with help from highly integrated circuits. Digital signal processors can be used in that case, which can perform the processing steps represented in the block circuit diagrams by means of suitable programming.

The following embodiments show in what way a parameter value (v(k)) can be estimated. In that case k specifies the time index of the sampled values, i.e. for parameters transmitted in frame form it is a frame counter, for parameters transmitted in subframe form it is a subframe counter, etc.

If the following concerns a "parameter", it can be e.g. a transmitted source-codec parameter, but it can also be a magnitude derived from a parameter through any invertible function v'(k)=f (v(k), . . . ). The resulting estimated value ve'(k) would have to be reconverted into the sought estimated value of the parameter by means of the inverse function ve(k)=$f^{-1}$ (ve'(k), . . . ). The embodiments are limited to the estimation of a real scalar parameter, although the arrangement can simply be parallelized and is thereby also able to estimate a vectorial parameter.

The embodiment of FIG. 1 first performs a prediction vp(k) of the parameter to be estimated v(k). To that end the input signal vh(k) is supplied to the error masking device 13 via input 1. The signal vh(k) then forms the input of the predictor 2. It is useful to select vh(k)=ve(k−1), i.e. the input signal of the predictor is equal to the estimated signal ve(k) itself (note the minimum delay of the predictor 2 due to a sampling clock). Other signals can also be envisioned as the basis for the prediction: e.g. the parameter decoded without any error masking mechanism. The predictor 2 can e.g. be a transversal filter of the order N with the impulse response A(k)={0,$a_1$,$a_2$, . . . , $a_N$, 0, . . . }.

The coefficients A(k) of the predictor 2 represent the time correlations of the parameter to be estimated. The prediction order N must encompass to the greatest extent the expansion of time correlations in the parameter under consideration. The prediction coefficients can be stored in a read-only manner in a memory unit, or they can also be adaptively reset at the receiving end via an LPC analysis or an LMS algorithm.

The prediction signal vp(k) is routed to a linear uniform quantizer 3. If the parameter $2^M$ has quantization levels (quantization with M bits), the quantizer 3 must have a number of L·$2^M$ quantization levels. In the following the integer value L designates a "resolution" and must be meaningfully selected in the 1 . . . 16 range (possibly even larger). The width of the quantization step of this linear uniform quantizer (a mid-treat characteristic is favorable) must be chosen so that the optimum modulation range is the same as that of the parameter quantizer in the source-coding method.

The quantizer output j(k) is in the 0 . . . L·$2^M$−1 range and represents the quantization table index.

In the following, a genuine parallel processing of simultaneously existing homogeneous signals may be selectively understood under a "vectorial" signal and its processing, or a serial processing of these homogeneous signals while only using a scalar operating device.

The "adjusting block" 4 now adjusts a given vectorial signal pa(1,k) by a number of L·$2^M$−j(k) vector dimensions, i.e.:

$$pv(m,k)=pa(m=1-[L \cdot 2^M-j(k)], k). \tag{1}$$

In this case 1 designates a counter for all vector dimensions in pa(l,k) where 0≦1≦L·$2^{M+1}$−1, and m is an adjust counter in the restricted range of 0≦m≦L·$2^M$−1.

This adjusting operation can also be carried out by copying the signal values pa(l,k) where 1=L·$2^M$−j(k), . . . , L·$2^M$+1−1−j(k) in pv(m,k) where m=0, . . . , L·$2^M$−1 or simply by suitably addressing the vector dimensions of the signal pa(l,k). The signal values of the adjusted signal pv(m,k) can be interpreted as a distribution function of the parameter estimation value ve(k) determined a priori, where the parameter is assumed to have been quantized with the quantizer 3. While the linear prediction only produces a prediction value based on past parameter values known at the receiving end, an a priori distribution is now known which however does not take the currently received parameter value and its reliability into consideration.

The L·$2^{M+1}$ values of the vectorial signal pa(l,k) at the clock time k represent the histogram of the prediction error signal e(k)=vp(k)−v(k), if the input signal vh(k) of the predictor 2 was equal to the error-free parameter v(k), and the prediction error signal e(k) was quantized by a linear uniform quantizer similar to 3, with the same step width but with L·$2^{M+1}$ quantization levels.

In the simplest configuration according to FIG. 1, the L·$2^{M+1}$ signal values of pa(l,k) are produced once with the aid of a large data base of the undisturbed parameter v(k) under consideration, and are kept available for reading-only in a memory unit 5 of the receiver. In this case the prediction error is modeled as a stationary process with a fixed distribution function and variance.

The vectorial signal pv(m,k) of the vector dimension L·$2^M$ is now added in sections by the adder 6, so that the result is a vectorial signal pp(i,k) where 0≦i≦$2^M$−1:

$$pp(i,k)=\Sigma_{m \times ui}^{vi} pv(m,k) \tag{2}$$

In this case ui or vi designate the lowermost or the uppermost quantization table index of quantizer 3 which, assuming an evenly distributed Input signal, can surely or most probably be assigned to the ith index of the 2M-step quantizer of the source-encoder. This operation resets the reference to the signal values pv(m,k), which can be interpreted as the a priori distribution function, to the potentially higher resolved linear uniform quantizer 3, and via pp(i,k) produces signal values which can be interpreted as a (still not normalized) a priori distribution function of the parameter, with reference to the quantizer of the source-encoder.

The vectorial signal pp(i,k) is now routed to a vectorial multiplier 7. After it is multiplied by the vectorial signal pc(i,k) by means of:

$$p(i,k)=pp(i,k) \cdot pc(i,k) \tag{3}$$

the result is a (still not normalized) probability for every quantization table index i at the transmitting end, through the signal values of the vectorial signal p(i,k), i=0.1, . . . , $2^M$−1. By routing the vectorial signal pc(i,k) via the $2^M$ clamps 10 and the described multiplication, the actually received parameter value at clock time k and its reliability are now taken into consideration. The generation of the signal pc(i, k), which is clearly a function of the transmission channel, can be performed e.g. as described in the "Error Concealment by Softbit Speech Decoding" ITG "Speech Communication" Conference Proceedings, Frankfurt am Main, September 1996.

The just cited literature also shows how any desired estimation methods 8 can be used with the $2^M$ values of p(i,k) at each sampled instant k, in order to obtain an estimated value ve(k) of the parameter v(k). A maximum a posteriori estimator (MAP) e.g. selects the particular parameter from the lookup table which is addressed with the particular i at which p(i,k) assumes the maximum signal value for all its. It produces many good error masking results, but an MS estimator which minimizes the average quadratic error $(ve(k)-v(k))^2$ is often more advantageous. When the latter is used, the m values of the vectorial signal p(i,k) must be normalized to the sum of 1 in every sampling clock k, or the respective normalization factor is used once for the parameter estimation value ve(k), which is more efficient to do.

In view of T. Lagerqvist, T. B. Minde, P. Mustel and H. Nilsson "Soft Error Concealment in a TDMA Radio System", U.S. Pat. No. #5,502,713, December 1993, it must be pointed out that with the method illustrated herein, not only is one quality value used per receiving parameter, but $2^M$, i.e. a reception probability exists for every possible transmitted parameter value. Furthermore in principle, the method makes no selection with the currently received parameter, but always operates up to the last parameter estimation 8 with signals that can be interpreted as a probability distribution.

FIG. 2 illustrates an embodiment for estimating parameters whose prediction error signal e(k) is difficult to model as a stationary once. In that case an adaptation of the coefficients at the receiving end is recommended for the-predictor 2, which was already mentioned earlier as an option. Beyond that, the memory unit 5 in FIG. 1 is replaced by an "a priori computer" 12, which can operate in various ways:

As a function of specified criteria, it can e.g. choose between different signals pa(l,k), which in turn are stored in one or several memory units.

As a function of specified criteria, it can e.g. undertake an offset addressing (i.e. a suitable under-sampling of the vector dimensions) for one or several stored vectorial signals with a higher vector dimension, in order to produce pa(l,k).

As a function of specified criteria, it can e.g. calculate different pa(d,k) signals.

For example, a variance e stimation of th e prediction error signal e(k) may be suitable as the decision criterion.

Since the error-free parameter v(k) is not available at the receiving end for calculating e(k), the following estimation of the prediction error signal e(k) is carried out by means of a subtracter 11:

$$ee(k)=vp(k)-vh(k) \quad (4)$$

With the help of known methods, a priori computer 12 is then able to estimate the variance of the signal ee(k) in suitable intervals, to enable it to provide to the adjusting block 4 the particular signal pa(l,k) which best represents the momentary signal characteristic of ee(k).

It can also be envisioned to produce the signal pa(l,k) entirely or partially (e.g. by weighting with corresponding signals from memory units), from a histogram of the quantized difference signal Q(ee(k)), which was produced at the decoder end. This presupposes a quantizer with the same quantization step width as quantizer 3, but with the quantization level of $L \cdot 2^{M+1}$.

What is claimed is:

1. A method for error masking and improvement of the signal quality in digital transmission systems, in which a distribution function for estimating transmitted parameters, including final estimated transmitted parameters, is determined at a receiving end of the digital transmission systems and uses an estimation method for generating the final estimated transmitted parameters, characterized in that a distribution function is adjusted around the output value of a predictor, and is integrated by sections into a new distribution function, and this new distribution function is multiplied by a distribution function which takes into account the reception quality and the result of an a posteriori distribution which is used with the estimation method for the generation, of the final estimated transmitted parameters.

2. A method for carrying out error masking claimed in claim 1, wherein the predictor receives an input signal and characterized in that earlier estimated parameters form the input signal to the predictor.

3. A method for carrying out error masking as claimed in claim 2, characterized in that the received parameters, or a mixture of earlier estimated parameters and the received parameters, form the input signal to the predictor.

4. A method for carrying out error masking as claimed in claim 1, characterized in that the predictor operates with one or several fixed sets of coefficients.

5. A method for carrying out error masking as claimed in claim 3, characterized in that the predictor operates with adaptively tracked sets of coefficients.

6. A method for carrying out error masking as claimed in claim 1, characterized in that the output value of the predictor is quantized for further processing.

7. A method for carrying out error masking as claimed in claim 1, characterized in that the distribution functions are available in discreted form, and the integration evolves into an aggregation.

8. A method for carrying out error masking as claimed in claim 1, characterized in that a distribution function which must be adjusted is stored in the receiver.

9. A method for carrying out error masking as claimed in claim 7, characterized in that several distribution functions are stored in the receiver and those that must be adjusted are selected in accordance with suitable criteria.

10. A method for carrying out error masking as claimed in claim 7, characterized in that one or several distribution functions are stored in the receiver, one is selected in accordance with suitable criteria, and the distribution function that must be adjusted is formed by selecting suitable signal values from the selected distribution function.

11. A method for carrying out error masking as claimed in claim 1, characterized in that the distribution function to be adjusted is entirely or partially calculated.

12. A method for carrying out error masking as claimed in claim 1, characterized in that the adjusting of the distribution function is performed by means of suitable addressing.

13. A method for carrying out error masking as claimed in claim 1, characterized in that the a posteriori distribution function is normalized to the aggregation signal value of one.

14. A method for carrying out error masking as claimed in claim 1, characterized in that the distribution function, which takes received quality into consideration, is uniformly distributed.

15. A method for carrying out error masking as claimed in claim 1, characterized in that the distribution function used for parameter estimation is targeted to minimize quadratic error associated with the signal quality.

16. A device for error masking and improvement of the signal quality in digital transmission systems, in which a distribution function for estimating transmitted parameters indicating final estimated transmitted parameters, is determined at a receiving end of the digital transmission systems and uses an estimation method for generating the final estimated transmitted parameters by a distribution function estimating means, wherein the distribution function estimating means has means for causing the distribution function to be adjusted around the output value of a predictor, and to be integrated by sections into a new distribution function, and further having means for multiplying the new distribution function by a distribution function that takes into account the reception quality as well as the result of an a posteriori distribution which is used with the estimation method for determining the final estimated transmitted parameters.

* * * * *